US009118172B2

(12) United States Patent
Radosavljevic et al.

(10) Patent No.: US 9,118,172 B2
(45) Date of Patent: Aug. 25, 2015

(54) PROTECTIVE DEVICE WITH AUTOMATED SELF TEST

(71) Applicant: Pass & Seymour, Inc., Syracuse, NY (US)

(72) Inventors: Dejan Radosavljevic, Lafayette, NY (US); Jeffrey C. Richards, Baldwinsville, NY (US); Kent R. Morgan, Groton, NY (US); David A. Finlay, Sr., Marietta, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 4 days.

(21) Appl. No.: 13/932,885

(22) Filed: Jul. 1, 2013

(65) Prior Publication Data

US 2013/0293990 A1 Nov. 7, 2013

Related U.S. Application Data

(63) Continuation of application No. 13/332,706, filed on Dec. 21, 2011, now Pat. No. 8,477,466, which is a continuation of application No. 13/311,147, filed on Dec. 5, 2011, now Pat. No. 8,437,108, which is a continuation of application No. 12/828,871, filed on (Continued)

(51) Int. Cl.
*H02H 3/16* (2006.01)
*H02H 1/00* (2006.01)
*H01H 83/04* (2006.01)
*H02H 3/33* (2006.01)
*G01R 31/327* (2006.01)
*H01H 71/04* (2006.01)
*H02H 3/05* (2006.01)

(52) U.S. Cl.
CPC .................. *H02H 1/00* (2013.01); *H01H 83/04* (2013.01); *H02H 3/335* (2013.01); *G01R 31/3277* (2013.01); *H01H 2071/044* (2013.01); *H02H 3/05* (2013.01); *H02H 3/338* (2013.01)
USPC .............................................. 361/42; 361/44

(58) Field of Classification Search
CPC combination set(s) only.
See application file for complete search history.

(56) References Cited

U.S. PATENT DOCUMENTS

| 4,672,501 A | 6/1987 | Bilac et al. |
| 4,742,422 A | 5/1988 | Tigges |
| 4,870,532 A | 9/1989 | Beatty et al. |
| 4,974,112 A | 11/1990 | Urich |
| 5,072,328 A | 12/1991 | Dvorek et al. |
| 5,202,662 A | 4/1993 | Bienwald et al. |
| 5,459,630 A | 10/1995 | MacKenzie et al. |
| 5,477,412 A | 12/1995 | Neiger et al. |

(Continued)

*Primary Examiner* — Danny Nguyen
(74) *Attorney, Agent, or Firm* — Daniel P. Malley; Bond Schoeneck & King, PLLC

(57) ABSTRACT

The present invention is directed to a circuit interrupting device including an actuator that provides an actuator stimulus upon the occurrence of the fault actuation signal. A circuit interrupter is positioned to electrically disconnect the first, second and third electrical conductors from each other upon the occurrence of the actuator stimulus. An automated test circuit is coupled to the circuit interrupting assembly. The automated test circuit is configured to automatically produce the simulated fault condition during a predetermined portion of an AC line cycle to determine whether the fault detection assembly is operational such that the fault detection assembly provides a fault detection signal without the circuit interrupter electrically disconnecting the first, second and third electrical conductors from each other. The automated test circuit is further configured to provide a device failure mode signal such that a plurality of the first, second or third electrical conductors are disconnected from each other if the fault detection signal is not detected within a predetermined time frame.

47 Claims, 4 Drawing Sheets

Related U.S. Application Data

Jul. 1, 2010, now abandoned, which is a continuation of application No. 11/256,703, filed on Oct. 24, 2005, now Pat. No. 7,751,160, which is a continuation-in-part of application No. 11/025,509, filed on Dec. 29, 2004, now abandoned, and a continuation-in-part of application No. 10/900,769, filed on Jul. 28, 2004, now Pat. No. 7,154,718, and a continuation-in-part of application No. 10/942,633, filed on Sep. 16, 2004, now Pat. No. 7,173,799, said application No. 11/025,509 is a continuation of application No. 10/868,610, filed on Jun. 15, 2004, now Pat. No. 6,980,005, which is a continuation of application No. 10/688,654, filed on Oct. 17, 2003, now abandoned.

(56) References Cited

U.S. PATENT DOCUMENTS

| | | | |
|---|---|---|---|
| 5,517,165 | A | 5/1996 | Cook |
| 5,559,664 | A | 9/1996 | Dogul et al. |
| 5,600,524 | A | 2/1997 | Neiger et al. |
| 5,715,125 | A | 2/1998 | Neiger et al. |
| 5,844,759 | A | 12/1998 | Hirsh et al. |
| 5,956,218 | A | 9/1999 | Berthold |
| 6,002,565 | A | 12/1999 | Ronisch |
| 6,052,265 | A | 4/2000 | Zaretsky et al. |
| 6,111,733 | A | 8/2000 | Neiger et al. |
| 6,246,558 | B1 | 6/2001 | DiSalvo et al. |
| 6,262,871 | B1 | 7/2001 | Nemir et al. |
| 6,288,882 | B1 | 9/2001 | DiSalvo et al. |
| 6,407,893 | B1 | 6/2002 | Neiger et al. |
| 6,437,700 | B1 | 8/2002 | Herzfeld et al. |
| 6,437,953 | B2 | 8/2002 | DiSalvo et al. |
| 6,477,022 | B1 | 11/2002 | Ennis et al. |
| 6,487,052 | B1 | 11/2002 | MacPherson et al. |
| 6,487,057 | B1 | 11/2002 | Natili |
| 6,525,541 | B1 | 2/2003 | Leopold |
| 6,611,406 | B2 | 8/2003 | Neiger et al. |
| 6,643,108 | B2 | 11/2003 | Cline et al. |
| 6,657,834 | B2 | 12/2003 | DiSalvo |
| 6,670,870 | B2 | 12/2003 | Macbeth |
| 6,671,145 | B2 | 12/2003 | Germain et al. |
| 6,674,289 | B2 | 1/2004 | Macbeth |
| 6,697,237 | B2 | 2/2004 | Duve |
| 6,697,238 | B2 | 2/2004 | Bonilla |
| 6,717,782 | B2 | 4/2004 | DiSalvo et al. |
| 6,724,591 | B2 | 4/2004 | Clarey et al. |
| 6,771,152 | B2 | 8/2004 | Germain et al. |
| 6,788,173 | B2 | 9/2004 | Germain et al. |
| 6,804,094 | B2 | 10/2004 | Kampmeyer |
| 6,807,035 | B1 | 10/2004 | Baldwin et al. |
| 6,807,036 | B2 * | 10/2004 | Baldwin ............ 361/42 |
| 6,828,886 | B2 | 12/2004 | Germain et al. |
| 6,829,124 | B2 | 12/2004 | Leopold et al. |
| 6,831,819 | B2 | 12/2004 | Nemir et al. |
| 6,856,498 | B1 | 2/2005 | Finlay, Sr. |
| 6,867,954 | B2 | 3/2005 | Wu et al. |
| 6,873,158 | B2 | 3/2005 | Macbeth |
| 6,920,025 | B2 | 7/2005 | Nelson |
| 6,930,574 | B2 | 8/2005 | Gao |
| 6,946,935 | B2 | 9/2005 | Wu et al. |
| 6,952,150 | B2 | 10/2005 | Radosavljevic et al. |
| 6,954,125 | B2 | 10/2005 | Wu et al. |
| 6,980,005 | B2 | 12/2005 | Finlay et al. |
| 6,998,945 | B2 | 2/2006 | Huang et al. |
| 7,019,952 | B2 * | 3/2006 | Huang et al. ............ 361/42 |
| 7,031,126 | B2 | 4/2006 | Bonilla et al. |
| 7,215,370 | B2 | 5/2007 | Wu et al. |
| 7,253,629 | B1 | 8/2007 | Richards et al. |
| 7,268,559 | B1 | 9/2007 | Chen et al. |
| 2005/0001607 | A1 | 1/2005 | Berland |
| 2005/0117264 | A1 | 6/2005 | Aromin |
| 2005/0140476 | A1 | 6/2005 | Gao |
| 2009/0147416 | A1 | 6/2009 | Zheng |

* cited by examiner

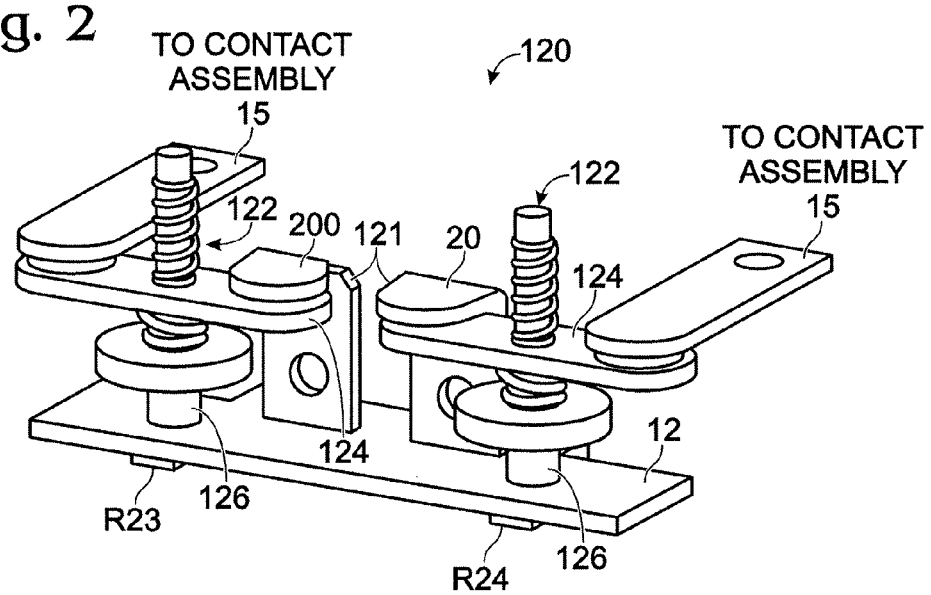
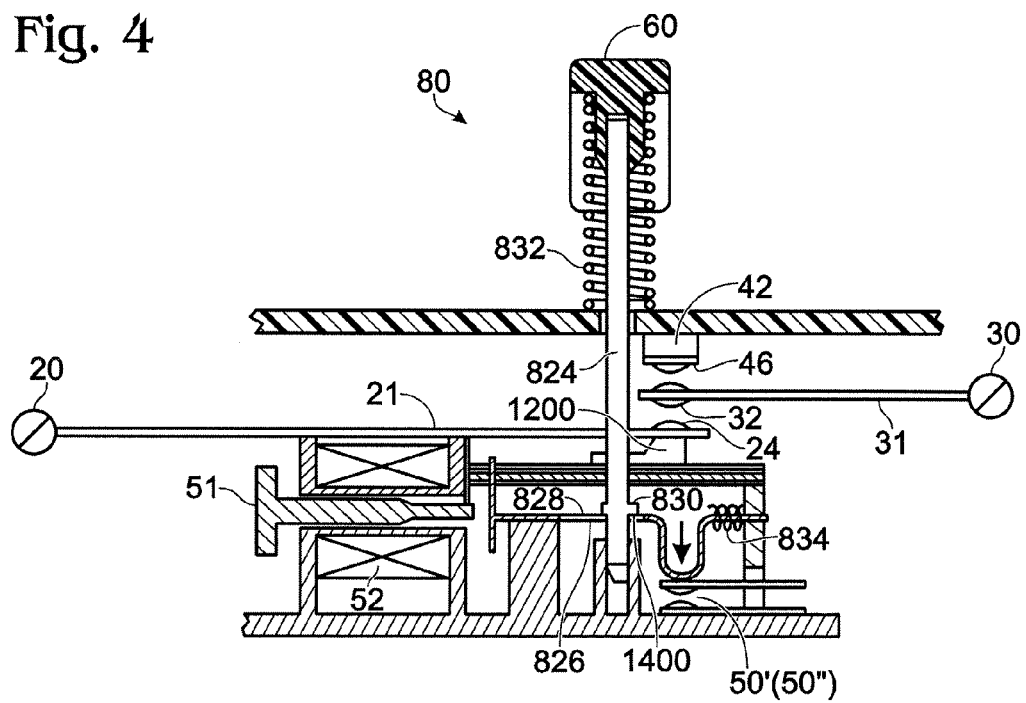

PROTECTIVE DEVICE WITH AUTOMATED SELF TEST

CROSS-REFERENCE TO RELATED APPLICATIONS

This application is a continuation of U.S. patent application Ser. No. 13/332,706 filed on Dec. 21, 2011, which is a continuation of U.S. patent application Ser. No. 13/311,147 filed on Dec. 5, 2011, which is a continuation of U.S. patent application Ser. No. 12/828,871 filed on Jul. 1, 2010, which is a continuation of U.S. patent application Ser. No. 11/256,703 filed on Oct. 24, 2005, U.S. patent application Ser. No. 11/256,703 is a continuation-in-part of U.S. patent application Ser. No. 11/025,509 filed on Dec. 29, 2004, U.S. patent application Ser. No. 10/900,769 filed on Jul. 28, 2004, and U.S. patent application Ser. No. 10/942,633 filed on Sep. 16, 2004, U.S. patent application Ser. No. 11/025,509 is a continuation of U.S. patent application Ser. No. 10/868,610 filed on Jun. 15, 2004, which is a continuation of U.S. patent application Ser. No. 10/688,654 filed on Sep. 23, 2003, the contents of all of which are relied upon and incorporated herein by reference in their entirety, and the benefit of priority under 35 U.S.C. §120 is hereby claimed.

BACKGROUND OF THE INVENTION

1. Field of the Invention

The present invention relates generally to electrical wiring devices, and particularly to electrical wiring devices having protective features.

2. Technical Background

Examples of electric circuit protection devices include ground fault circuit interrupters (GFCIs), arc fault circuit interrupters (AFCIs), or devices that include both GFCIs and AFCIs in one protective device. An electric circuit typically includes at least one protection device disposed in the breaker box, in a duplex receptacle, in an electrical plug, or the like. The most common fault conditions are ground faults and arc faults. The function of a protection device is to detect the fault and then remove power to the load circuit to substantially eliminate the possibility of shock or fire.

An arc fault is a discharge of electricity between two or more conductors. There are two types of arc faults. One type is a parallel arc fault, and the other is known as a series arc fault. A parallel arc fault is caused by damaged insulation on the hot line conductor or neutral line conductor, or on both the hot line conductor and the neutral line conductor, such as from an overdriven staple. The damaged insulation may cause an arc between the two conductors and may result in a fire. A series arc may be caused by a break in the line or neutral conductors of the electrical distribution system or by a loose wiring device terminal. An arc fault usually manifests itself as a high frequency current signal that typically exhibits a concentration of energy in certain frequency bands. As such, AFCIs may be configured to detect arc faults by being designed to recognize the aforementioned high frequency signature.

A ground fault, on the other hand, is a condition that occurs when a current carrying (hot) conductor contacts ground to create an unintended current path. The unintended current path represents an electrical shock hazard. A ground fault may also represent a fire hazard. A ground fault may occur for several reasons. If the wiring insulation within a load circuit becomes damaged, the hot conductor may contact ground, creating a shock hazard for a user. A ground fault may also occur when equipment comes in contact with water. A ground fault may also be caused by damaged insulation within the facility.

Under normal operating conditions, the current flowing in the hot conductor should equal the current in the neutral conductor. A ground fault upsets this balance and creates a differential current between the hot conductor and the neutral conductor. GFCIs exploit this phenomenon by comparing the current in the hot conductor(s) to the return current in the neutral conductor. In other words, a ground fault is typically detected by sensing the differential current between the two conductors. Upon detecting a ground fault, the GFCI may respond by actuating an alarm and/or interrupting the circuit.

A grounded neutral condition is another type of fault condition that occurs when the load neutral terminal, or a conductor connected to the load neutral terminal, becomes grounded. While this condition does not represent an immediate shock hazard, it is nonetheless an insidious double-fault condition that may lead to a serious injury or a fatality. The reasons for this become apparent when one considers that GFCIs are configured to trip when the differential current is greater than or equal to approximately 6 mA. However, when the load neutral conductor is grounded the GFCI becomes de-sensitized because some of the return path current is diverted to ground. Under these conditions, it may take up to 30 mA of differential current before the GFCI trips. Accordingly, when a fault occurs in a grounded neutral state, the GFCI may fail to trip, exposing a user to experience serious injury or death. There are other reasons why a protective device may fail to perform its function.

The protective device includes electronic and mechanical components that may experience an end-of-life (EOL) condition. For example, protective devices must include some type of fault sensor and detector. The detector output is coupled to an electronic switch. When the switch is turned ON a solenoid is energized. The energized solenoid drives a circuit interrupter in turn. Of course, the circuit interrupter disconnects the load terminals from the line terminals when a fault is detected. Component failure may occur for a variety of reasons. Failure may occur because of the normal aging of electronic components. Mechanical parts may become corroded, experience mechanical wear, or fail because of mechanical abuse. Devices may also fail when they are overloaded when installed. Electrical power surges, such as from lightning, also may result in failure. If any of the sensor, the detector, the switch, solenoid, and/or power supply fail, i.e., an EOL condition is extant, the GFCI may fail to trip, exposing a user to experience serious injury or death. There are other reasons why a protective device may fail to perform its function. Accordingly, a protection device that denies power to a load circuit in the event of an EOL condition is desirable.

In one approach that has been considered, a protective device is equipped with a manually activated test button for determining the operating condition of the device. If the test fails the circuit interrupter permanently disconnects the load terminals from the line terminals. One drawback to this approach relates to the fact that the device only reacts to a problem if the user activates the test button. As such, this approach does not address the aforementioned EOL scenario. Another drawback to this relates to the fact that even if the device is manually tested, an inoperative circuit interrupter allows a fire or shock hazard to persist indefinitely.

In another approach that has been considered, a protective device may be equipped with an automatic test feature. In this approach, the automatic test mechanism periodically tests the device without user intervention. A failed test automatically causes the circuit interrupter to permanently disconnect the load terminals from the line terminals. The drawback to this approach is similar to the manual approach described above. The auto-test device also provides unprotected power to the load circuit when the circuit interrupter is experiencing an EOL condition.

Accordingly, a protective device is needed having a test feature for detecting failure of both electrical components and electro-mechanical components. Further, what is needed is a device having a separate test mechanism configured to deny power to a load circuit in response to the aforementioned EOL conditions.

SUMMARY OF THE INVENTION

The present invention addresses the needs described above. As such, the present invention is directed to a protective device that has a test feature for detecting failure of both electrical components and electro-mechanical components. The protective device of the present invention also includes a separate test mechanism configured to deny power to a load circuit in response to the aforementioned EOL conditions.

One aspect of the present invention is directed to a circuit interrupting device configured to be coupled to a source of AC power. The device includes a first electrical conductor, a second electrical conductor, and a third electrical conductor where the first, second and third electrical conductors are electrically isolated from each other and at least one of said conductors is capable of electrically connecting with the other two conductors such that the first, second and third electrical conductors are electrically connected to each other. A fault detection assembly including a plurality of sensor elements is coupled to the first, second or third electrical conductors. The fault detection assembly is configured to provide a fault actuation signal in response to a fault condition or a simulated fault condition. An actuator is coupled to the fault detection assembly. The actuator provides an actuator stimulus upon the occurrence of the fault actuation signal. A circuit interrupter is positioned to electrically disconnect the first, second and third electrical conductors from each other upon the occurrence of the actuator stimulus. An automated test circuit is coupled to the circuit interrupting assembly. The automated test circuit is configured to automatically produce the simulated fault condition during a predetermined portion of an AC line cycle to determine whether the fault detection assembly is operational such that the fault detection assembly provides a fault detection signal without the circuit interrupter electrically disconnecting the first, second and third electrical conductors from each other. The automated test circuit is further configured to provide a device failure mode signal such that a plurality of the first, second or third electrical conductors are disconnected from each other if the fault detection signal is not detected within a predetermined time frame.

In another aspect, the present invention is directed to a circuit interrupting device that includes a first electrical conductor, a second electrical conductor, and a third electrical conductor where the first, second and third electrical conductors are electrically isolated from each other and at least one of said conductors is capable of electrically connecting with the other two conductors such that the first, second and third electrical conductors are electrically connected to each other. A latch block is coupled to the at least one of said conductors that is capable of electrically connecting with the other two conductors, the latch block having a first opening defined therein and configured to move between a first position which provides electrical continuity between the first, second and third electrical conductors and a second position which breaks electrical continuity between the first, second and third electrical conductors. A circuit interrupter assembly is configured to movably engage a latch having a second opening defined therein and positioned to substantially align with the first opening of the latch block to move the latch block from the first position to the second position upon the occurrence of a fault or a simulated fault if the device is operational. A user-actuatable button is configured to movably reorient the latch block to the first position when the latch is disengaged by the circuit interrupter to reestablish electrical continuity between the first, second and third electrical conductors after resolution of the fault condition or a simulated fault condition. An automated test circuit is coupled to the circuit interrupting assembly, the automated test circuit being configured to automatically produce the simulated fault during a predetermined portion of an AC line cycle to determine if the device is operational wherein a simulated fault detection signal is propagated without electrically disconnecting the first, second and third electrical conductors from each other, the automated test circuit being further configured to provide a device failure mode signal such that the plurality of the first, second or third electrical conductors are disconnected from each other if the simulated fault detection signal is not detected within a predetermined time frame.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 2 is a detailed perspective view of an end-of-life mechanism employed in the electrical device depicted FIG. 1;

FIG. 4 is a detail view of a latch mechanism in accordance with the present invention;

DETAILED DESCRIPTION

Figure 1:
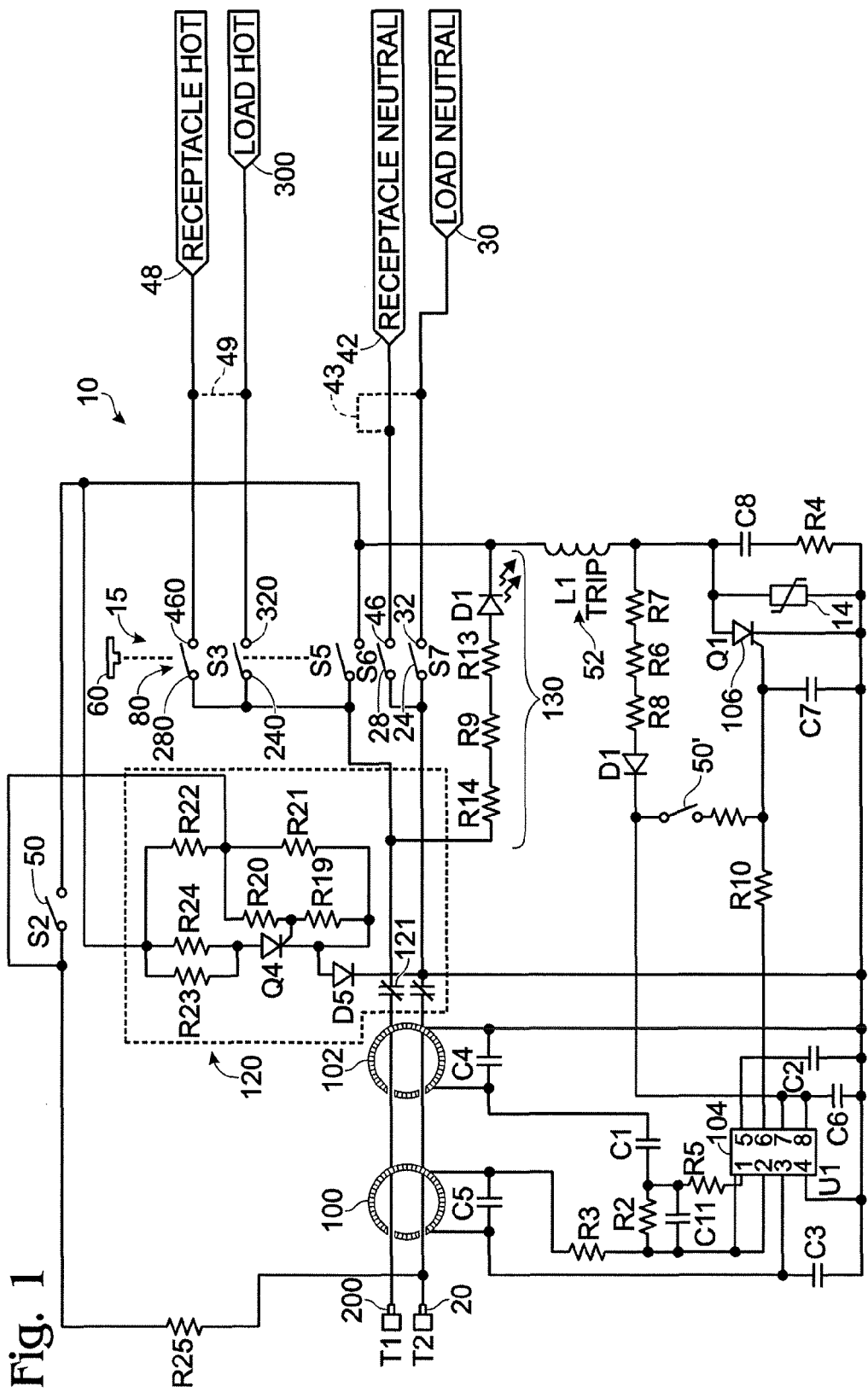
FIG. 1 is a schematic of the electrical device in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protective device of the present invention is shown in FIG. 1, and is designated generally throughout by reference numeral 10.

As embodied herein, and depicted in FIG. 1, a schematic of the electrical device 10 in accordance with one embodiment of the present invention is shown. While the schematic in FIG. 1 is directed to a GFCI, the present invention is equally applicable to AFCIs and/or other such protective devices.

Device 10 includes hot line contact 200 and neutral line contact 20 coupled to ground fault sensor 100 and grounded neutral sensor 102. As shown in FIG. 1, the outputs of sensor 100 and sensor 102 are coupled to detector 104. The detector 104 out put (pin 7) is connected to the control input of silicon controlled rectifier (SCR) SCR 106. SCR 106 is coupled to solenoid 52, which is energized when SCR 106 is turned ON by detector 104. A plunger disposed in solenoid 52 engages latch mechanism 80 to thereby open the contacts in contact assembly 15. Contact assembly 15 is disposed between line terminals (20, 200), and load terminals (30, 300) and receptacle load terminals (42, 48). Contact assembly 15 is configured to establish electrical connectivity between the line terminals (20, 200), and load terminals (30, 300) and receptacle load terminals (42, 48) when latch mechanism 80 is in a reset state. Contact assembly 15 is configured to disconnect the line terminals (20, 200) from the load terminals (30, 300) and receptacle load terminals (42, 48) when latch mechanism 80 is in a tripped state.

With regard to contact mechanism 15, neutral line terminal 20 is connected to contact member 24 and contact member 28. Contact members 24 and 28 are operatively coupled to latch mechanism 80. In other words, contact member 24 connects neutral line terminal 20 to neutral load feed-through terminal 30 and contact member 28 connects neutral line terminal 20 to neutral receptacle contact 42 when the latch mechanism 80 is disposed in the reset position. The connectivity is established when contact member 24 is in electrical continuity with contact 32 and contact member 28 in electrical continuity with contact member 46. On the other hand, when solenoid 52 drives latch mechanism 80 into the tripped position, contact members 24 and 28 are deflected to break electrical connectivity with contacts 32 and 46, respectively.

The moveable contact assembly in the hot conductive path is identical. Moveable contact members 240 and 280 mate with fixed contacts 320 and 460 respectively. In doing so, they electrically couple/decouple the hot line terminal 200 to hot load feed-through terminal 300 and neutral receptacle contact 48 depending on whether the latch mechanism 80 is in the reset state or in the tripped state.

The contact assembly 15 shown in FIG. 1 is representative of what is commonly referred to as a four-pole contact mechanism. It will be apparent to those of ordinary skill in the pertinent art that contact assembly 15 of the present invention may be of any suitable type depending on various considerations. For example, contact assembly 15 may employ a cantilevered contact assembly, a bridge structure, a bus bar arrangement, solid state devices, or any suitable contact mechanism. In a four-pole arrangement, the receptacle load terminals and the feed-through terminals are electrically isolated from each other in the tripped state, as well as being disconnected from the line terminals.

The contact assembly 15 of the present invention may also be implemented as, what is commonly referred to, a two-pole mechanism. In a two-pole embodiment, contact assembly 15 is similar to the above description except that each of the contact pairs 28 and 46, and 280 and 460 are replaced by a non-interruptible conductive path. As such, receptacle terminal 42 is directly and uninterruptedly connected to load terminal 30. This connection is represented by dotted line 43. Likewise, receptacle terminal 48 is directly and uninterruptedly connected to load terminal 300. This connection is represented by dotted line 49. As those of ordinary skill in the art will appreciate, in a two-pole arrangement, while the receptacle load terminals and the feed-through terminals are disconnected from the line in the tripped state, they are not electrically isolated from each other in the tripped state.

The contact assembly 15 of the present invention may also be implemented as, what is commonly referred to, a three-pole mechanism. In a three-pole embodiment, contact assembly 15 is similar to the above description except that either contact pair 28 and 46, or 280 and 460 are replaced by a non-interruptible conductive path. As such, either receptacle terminal 42 is directly and uninterruptedly connected to load terminal 30 by way of dotted line 43, or receptacle terminal 48 is directly and uninterruptedly connected to load terminal 300 by way of dotted line 49. As those of ordinary skill in the art will appreciate, while the receptacle load terminals and the feed-through terminals are disconnected from the line in the tripped state, power cannot be provided from the load terminals to the feed-through load terminals in the tripped state in a three-pole arrangement.

Device 10 also includes a reset mechanism 60 coupled to latch mechanism 80. As briefly noted above, latch 80 is driven into the tripped state by solenoid 52. Once the fault is cleared and the user recognizes that the device 10 has tripped, the user presses the reset button 60 to restore service. When reset button 60 is actuated, latch mechanism 80 closes, or permits the closure of the contacts disposed in contact assembly 15 to restore AC power to the receptacle load and feed-through load.

Device 10 includes an electronic TEST button 50. Latch mechanism 80 is driven into the tripped position when test button 50 is depressed by a user, if device 10 is operating properly. In particular, as the schematic of FIG. 1 suggests, a differential current simulating a ground fault is generated when the electrical TEST button 50 is actuated by the user. Trip solenoid 52 is fired when sensor 100 and detector 104 detect a fault condition. In response thereto, the contacts 32, 46, 320, and 460 open to disconnect the line, load, and receptacle contacts.

The present invention also includes a trip indicator circuit 130. When device 10 is tripped, trip indicator 130 is activated. Trip indicator 130 includes components R9, R13, R14, and D1 (LED) which are connected in parallel with switch S5. When device 10 is tripped, LED D1 is illuminated. However, when the contacts are reset, there is no potential difference across the LED and D1 is not illuminated. Those of ordinary skill in the art will recognize that indicator 130 may include an audible annunciator as well as an illumination device.

One feature of the present invention relates to the separate EOL functionality disposed in end-of-life (EOL) circuit 120. EOL circuit 120 includes resistors R19-R25, test button 50, SCR Q4, and diode D5. Resistors R20-R22 and SCR Q4 form a latch circuit. R21 and R22 are arranged in a voltage divider configured to control the operation of Q4. R23 and R24 are coupled to Q4. R23 and R24 are surface-mounted fusible resistors that control the activation of the EOL mechanism.

The user pushes the TEST button 50 when the GFCI is reset to generate a simulated fault through R25. Concurrently, 120V AC power is applied to fusible resistor R21. If the GFCI is operating properly, sensor 100, detector 104, and other GFCI circuitry will respond to the simulated fault and trip latch mechanism 80 within about 25 milliseconds. The simulated fault current flowing through R25 is terminated even if TEST button 50 is still being pushed. As the same time, power is removed from resistor R21.

If the GFCI circuitry is not operating properly, it will fail to trip in the manner described above. In response to the continuous application of AC power, the resistance of fusible R21 increases significantly changing the value of the R21/R22 voltage divider. In turn, the voltage across R20 and R19 becomes sufficient to turn Q4 ON, and current begins to flow through resistors R23 and R 24. The resistance values of resistors R23 and R24 increase when power is continuously applied for a sufficient duration. The values will increase from several kilo-ohms to values that are typically greater than 10 meg-ohms Subsequently, R23 and R24 begin to overheat and the solder that secures R23 and R24 to printed circuit board 12 fails. After the solder melts, resistors R23 and R24 are displaced, actuating EOL contacts 121. When the temperature of resistors R23, R24 is greater than the threshold, the line terminals (20, 200) are decoupled from the feedthrough load terminals (30, 300) and the receptacle load terminals (42, 48), independent of the state of circuit interrupting contacts 15.

Those of ordinary skill in the art will appreciate that because resistors R23, R24 are disposed in parallel, they heat independently. Resistor R23 is configured to open one of the EOL contacts 121, while resistor R24 is configured to independently open the other. In an alternate embodiment of the present invention, a single fusible resistor is configured to heat and open both EOL contacts 121.

In an alternate embodiment, device 10 may include TEST button 50' disposed between the power supply and the control input of SCR 106. When button 50' is depressed, SCR 106 is turned ON and device 10 is tripped. As such, TEST button 50' checks the operability of SCR 106 and solenoid 52, but not the operability of sensors 100, 102 or detector 104. The test signal generated by TEST button 50' is not a simulation of an external fault condition. Switch 50' simply initiates a current to turn SCR 106 ON. If the SCR 106 turns ON and causes the trip mechanism to operate, the EOL 120 mechanism is not actuated. If the trip mechanism does not operate, EOL 120 will operate.

Figure 5:
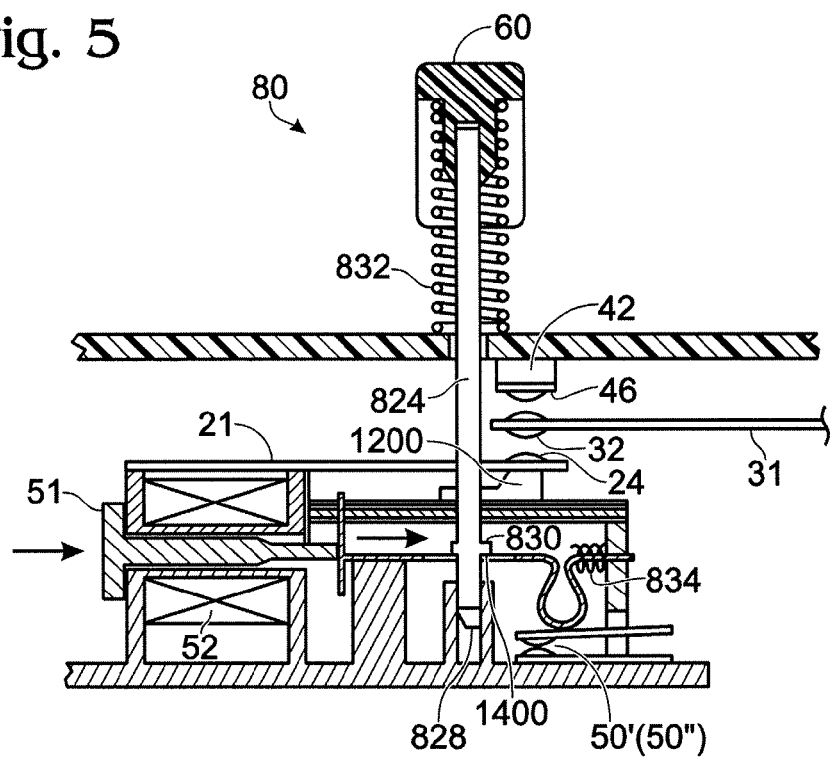
FIG. 5 is another view of the latch mechanism of FIG. 4.
Figure 6:
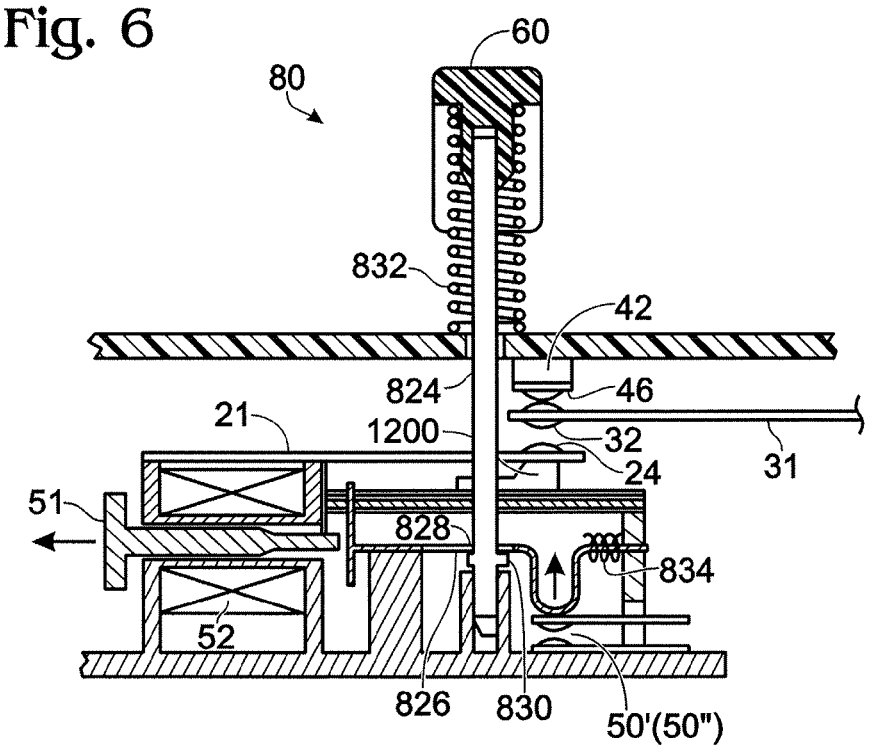
FIG. 6 is yet another view of the latch mechanism of FIG. 4.

As shown in FIG. 1, the test button 50 and reset button 60 are separate, user accessible buttons. In an alternative embodiment, the test functionality may be incorporated into reset button 60 to create a unitized reset/test button. FIGS. 4-6, described in detail below, provide a mechanical implementation of the combined reset/test button. In FIGS. 4-6, test contacts 50' (50") are coupled to the reset button, and hence, are not directly accessible to the user. However, test contacts 50' (50") are closed when the unitized button is actuated. If device 10 is in the tripped state, the unitized button 60 may be depressed and released to reset the circuit interrupting contacts 15 in the manner previously described. Before the device is reset, test contacts 50" are closed to activate a test cycle. If the protective device is operational, the circuitry functions normally and the EOL mechanism 120 is not actuated. However, if device 10 is experiencing an EOL condition, the EOL mechanism 120 is actuated, and the load terminals are permanently disconnected from the line terminals. The EOL determination is made each time the unitized button is actuated, whether to reset the device or to test the device already in the reset state. The periodic testing of the device is typically required to be performed on a monthly basis or before each use of the device. Those skilled in the art will also appreciate that the test button 50' (shown in FIG. 1) may also be incorporated into the unitized structure as shown in FIGS. 4-6.

As embodied herein and depicted in FIG. 2, a perspective view of the EOL mechanism 120 shown in FIG. 1 is disclosed. Resistors R23 and R24 are soldered to the underside of printed circuit board (PCB) 12. Openings are disposed in PCB 12 in alignment with resistors R23 and R24. Resistors R23 and R24 prevent spring loaded plungers 122 from extending through the openings 126 in board 12. Each plunger 122 is configured to support an electrically connecting bus-bar member 124. Each bus-bar 124 couples a line terminal (20, 200) to the contact assembly 15. As described above, when the solder supporting R23 and R24 melts, spring loaded plungers 122 are driven through the holes, breaking the connections between the line and load terminals. Once this occurs, there is no mechanism for resetting the device. Accordingly, the device must be replaced. In an alternate embodiment, resistors R23, R24 are configured to melt and "burn" open. The result is similar. Spring-loaded plungers 122 are driven through the holes, breaking the connections between the line and load terminals.

In an alternate embodiment, the EOL mechanism is a single pole mechanism which interrupts electrical connectivity either to line terminal 20 or line terminal 200 (not shown.) As those of ordinary skill in the art will appreciate, in a single-pole arrangement, the opening of the single pole serves to deny power conveyance from the line to the load.

In yet another alternate embodiment, the end of life mechanism is disposed between the load terminals and the circuit interrupter as a double pole mechanism. One pole interrupts electrical connectivity between a line terminal and a corresponding feed-through terminal in response to an end of life condition. The other pole interrupts electrical connectivity between the line terminal and a corresponding receptacle terminal in response to the end of life condition.

Figure 3:
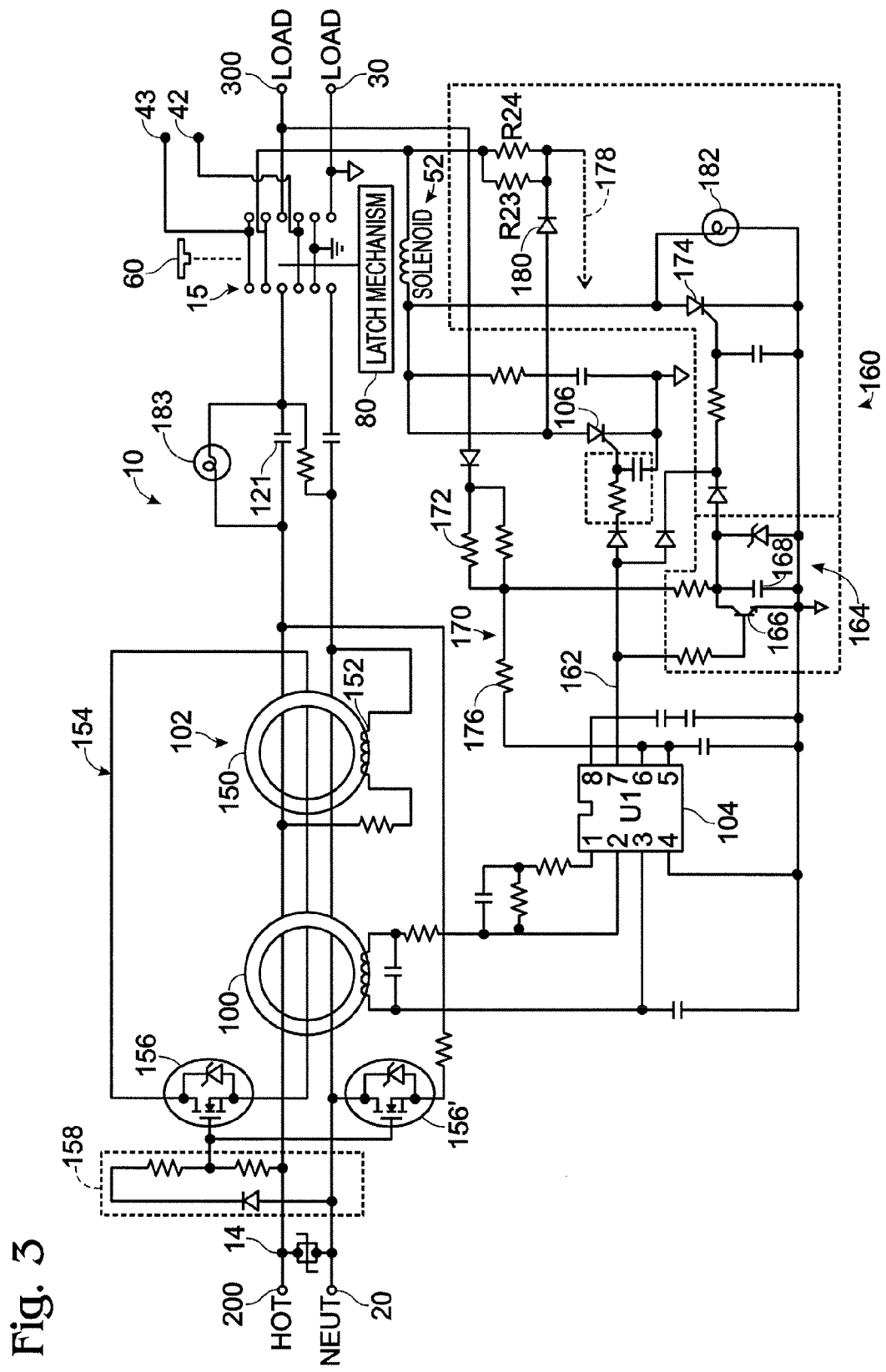
FIG. 3 is a schematic of the electrical device in accordance with a second embodiment of the present invention.

Referring to FIG. 3, an alternate schematic of the electrical device of the present invention is disclosed. This embodiment combines an auto-test circuit with an end-of-life circuit. This design may be employed in conjunction with any of the embodiments of the invention. This circuit is similar to the circuit depicted in FIG. 1, and the end-of-life circuit/mechanism is similar to that shown above.

Device 10 includes hot line contact 200 and neutral line contact 20 coupled to ground fault sensor 100 and grounded neutral sensor 102. The ground fault sensor 100 and grounded neutral sensor 102 are coupled to detector 104. Grounded neutral sensor 102 includes a saturating core 150 and a winding 152 coupled to hot and neutral line terminals 200 and 20, respectively. Those of ordinary skill in the art will recognize that it is typical practice to intentionally ground neutral line terminal 20 at the service panel of the electrical distribution system. During a true grounded neutral condition, neutral load terminal 30 is inadvertently grounded.

A grounded neutral fault condition, and the resulting path through ground by way of terminals 20 and 30, may be simulated by electrical loop 154. When electrical loop 154 is closed, saturating core 150 induces current spikes in the electrical loop 154. Reversals in the magnetic field in core 150 corresponded to the zero crossings in the AC power source. The reversals in the magnetic field generate current spikes. Current spikes occurring during the negative-transitioning zero crossings produce a signal during the negative half cycle portions of the AC power source. The signal is sensed as a differential signal by ground fault sensor 100, and detected by ground fault detector 104. In response, SCR 106 enables solenoid 52 to trip latch mechanism 80.

The simulated grounded neutral condition is enabled when switch 156 turns ON, to thereby close electrical loop 154. Control circuit 158 turns switch 156 ON during the negative half cycle. Thus, the current spikes occur during the negative half cycle portions but not during the positive half cycle portions of the AC power signal. Note that while output 162 of ground fault detector 104 attempts to actuate SCR 106, it cannot do so because SCR 106 is reverse biased during the negative half cycle. As a result, the simulated fault test is unable to turn SCR 106 ON. However, output signal 162 from ground fault detector 104 is used by EOL checking circuit 160 to determine whether or not an end of life condition has occurred. In response to a true ground fault or grounded neutral condition, ground fault detector 104 signals SCR 106 to actuate solenoid 52 to trip the latch mechanism 80 during the positive half cycle portions of AC power source.

In an alternate embodiment, device 10 includes switch 156' as a means for automatically simulating a ground fault. Device 10 may incorporate one or both of these testing features. The ground fault test likewise occurs during the negative half cycles of the AC power source. Those skilled in the art are familiar with any number of simulated signals that may be used by the EOL circuit to determine the operative status of the device.

It will be apparent to those of ordinary skill in the pertinent art that any suitable device may be employed to implement switch 156 (156'). For example, switch mechanisms 156 (156') may be implemented using a MOSFET device, such as the device designated as MPF930 and manufactured by ON Semiconductor. In another embodiment, switch 156 (156') may be monolithically integrated in the ground fault detector 104.

When a simulated grounded neutral condition is introduced in the manner described above, a test acceptance signal is provided to delay timer 164 during the negative half cycle portions of the AC power source. Delay timer 164 includes a transistor 166 that discharges capacitor 168 when the test acceptance signal is received. Capacitor 168 is recharged by power supply 170 by way of resistor 172 during the remaining portion of the AC line cycle. Again, if there is an internal failure in GFCI 10, the test acceptance signal will not be generated and transistor 166 will not be turned ON. As a result, capacitor 168 continues to charge until it reaches a predetermined voltage. At the predetermined voltage, SCR 174 is activated during a positive half cycle portion of the AC power source signal. In response, solenoid 52 drives latch mechanism 80 into the tripped state.

Note that both ground fault detector 104 and checking circuit 160 derive power from power supply 170. Redundant components may be added such that if one component has reached end of life, another component maintains the operability of ground fault detector 104, thereby enhancing reliability, or at least assuring the continuing operation of the checking circuit 160. For example, resistor 172 in power supply 170 may be equipped with parallel resistors. As another example, resistor 176 may be included to prevent the supply voltage from collapsing in the event the ground fault detector 104 shorts out. Clearly, if the supply voltage collapses, delay timer 168 may be prevented from signaling an end of life condition. The present invention should not be construed as being limited to the aforementioned examples as those of ordinary skill in the art will recognize that there are a number of redundant components that can be included in device 10.

Checking circuit 160 is ineffectual if latch mechanism 80 and/or solenoid 52 is experiencing an end of life condition. For example, solenoid 52 may have an electrical discontinuity. This failure mode may be obviated by the present invention by connecting SCR 174 to end-of-life resistors R23, R24 instead of being connected to solenoid 52. This embodiment is shown by dotted line 178. Of course, EOL resistors R23, R24 have been previously described. At end of life, SCR 174 conducts current through R23, R24 to cause them to fail, causing EOL contacts 121 to permanently disconnect the line terminals from the load terminals.

Dislodging of resistors R23, R24 results in a permanent decoupling of the load side of device 10 from the AC power source. Accordingly, it is important that the dislodgement (or burn out) of the resistors only occur in response to a true EOL condition, and not due to some spurious circumstance, such as transient electrical noise. For example, SCR 174 may be turned ON in response to a transient noise event. However, coupling diode 180 may be included to decouple resistor R23, R24 in the event of a false EOL condition. When SCR 174 is ON, coupling diode 180 allows SCR 174 to activate solenoid 52. Latch mechanism 80 trips, whereupon resistors R23, R24 are decoupled from the AC power source. As in the previous embodiment, device 10 includes a trip indicator 182, which may be an audible and/or visible indicator.

The present invention may include an EOL indicator that is activated when device 10 has reached end-of-life. EOL indicator 183 is disposed across contacts 121. Of course, there is no potential difference between contacts 121 before an end-of-life condition has occurred. However, when contacts 121 open in response to an end-of-life condition, EOL indicator 183 is activated. Those of ordinary skill in the art will recognize that indicator 183 may include an audible annunciator as well as an illumination device. Indicator 183 emits a steady output at end-of-life, or a non-steady output such as a beeping sound or a flashing light.

Referring to FIG. 4, a detail view of latching mechanism 80 in accordance with one embodiment of the present invention is disclosed. In FIG. 4, contact 24, disposed on neutral line cantilever 21, is separated from dual load cantilever contact 32, and fixed receptacle contact 46 in a tripped state. Of course, neutral line cantilever 21 is coupled to neutral line terminal 20. Dual load cantilever contact 32 is connected to cantilever 31, which in turn is connected to neutral feed-through terminal 30. Reset is effected by applying a downward force to reset button 60. Shoulder 1400 on reset pin 824 bears downward. In the embodiment depicted in FIG. 4, TEST contacts 50' (50") are shown. Those of ordinary skill in the art will recognize that latch mechanism 80 and reset mechanism 60 may be implemented without incorporating test contacts 50' (50"). However, in FIG. 4, pin 824 bears down on switch 50' (50") to effect a TEST cycle.

In FIG. 5, neutral line contact 24, load contact 32, and fixed receptacle contact 46 are still separated. As noted above in reference to the embodiment of FIG. 1, when switch 50' is closed SCR 106 is turned ON causing solenoid 52 to trip the device without simulating a fault condition, if the SCR 106 and solenoid are operational, and if the device is properly wired. On the other hand, when switch 50" is fully closed, a simulated fault condition is generated. The simulated fault signal is sensed and detected, causing solenoid 52 to activate armature 51. Armature 51 moves in the direction shown, permitting the hole 828 in latch 826 to become aligned with shoulder 1400. The downward force applied to unitized button 60 causes shoulder 1400 to continue to move downward, since it is no longer restrained by shoulder 1400.

Referring to FIG. 6, since shoulder 1400 is disposed beneath latch 826; it is no longer able to apply a downward force on latch 826. Accordingly, switch 50' (50") opens causing the TEST signal to cease. As a result, solenoid 52 is de-energized. Armature 51 moves in the direction shown in response to the biasing force of spring 834 and latch 826 is seated on latching escapement 830. As a result, device 10 is reset, closing contacts 24, 32, and 46. Further, the EOL mechanism 120 has not been activated because switch 50' (50") is only closed for the time it takes to trip device 10, i.e., about 25 milliseconds. This is too short a period of time to actuate the EOL mechanism.

On the other hand, if the circuitry of protective device 10 is experiencing an EOL condition, armature 51 fails to move in response to closure of switch 50' (50"). Shoulder 1400 continues to maintain closure of switch 50' (50") for a duration substantially greater than the expected trip time of the device, i.e., at least 500 milliseconds. Accordingly, the EOL mechanism 120 is configured to activate in the manner previously described. If the latch mechanism 80 of protective device 10 is experiencing an EOL condition, for example, the immobilization of armature 51 or latch 826 as the result of dirt or corrosion, switch 50' (50") will remain closed for a duration substantially greater than the expected trip time of the device. Accordingly, device 10 is responsive to EOL conditions in the GFCI circuitry as well as mechanical EOL conditions.

If switch 50' (50") is provided, the latch mechanism 80 may be tripped by way of a user accessible button (not shown) that is coupled to latch 826. When the button is depressed, latch 826 moves in the direction shown in FIG. 5 thus causing the mechanism to trip. As has been described above, resetting of latch mechanism 80 may then be accomplished by depressing reset button 60.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A circuit interrupting device configured to be coupled to a source of AC power comprising:
   a first electrical conductor, a second electrical conductor, and a third electrical conductor where the first, second and third electrical conductors are electrically isolated from each other and at least one of said conductors is capable of electrically connecting with the other two conductors such that the first, second and third electrical conductors are electrically connected to each other;
   a fault detection assembly including a plurality of sensor elements coupled to the first, second or third electrical conductors, the fault detection assembly being configured to provide a fault actuation signal in response to a fault condition or a simulated fault condition;
   an actuator coupled to the fault detection assembly, the actuator providing an actuator stimulus upon the occurrence of the fault actuation signal;
   a circuit interrupter positioned to electrically disconnect the first, second and third electrical conductors from each other upon the occurrence of the actuator stimulus; and
   an automated test circuit coupled to the circuit interrupter, the automated test circuit being configured to automatically produce the simulated fault condition during a predetermined portion of an AC line cycle to determine whether the fault detection assembly is operational such that the fault detection assembly provides a fault detection signal without the circuit interrupter electrically disconnecting the first, second and third electrical conductors from each other, the automated test circuit being further configured to provide a device failure mode signal such that a plurality of the first, second or third electrical conductors are disconnected from each other if the fault detection signal is not detected within a predetermined time frame.

2. The device of claim 1, wherein the automated test circuit operates without execution of software instructions.

3. The device of claim 1, wherein the automated test circuit includes or is coupled to an end-of-life mechanism configured to permanently decouple the first electrical conductor from the second electrical conductor.

4. The device of claim 3, wherein the end-of-life mechanism includes at least one fusible element, the automated test circuit being configured to conduct an electrical current through the at least one fusible element to disconnect the plurality of the first, second or third electrical conductors from each other when the fault response signal is not detected within the predetermined time frame.

5. The device of claim 1, wherein the first electrical conductor is a line conductor and the second electrical conductor is a feed-through load conductor.

6. The device of claim 5, wherein the third electrical conductor includes face receptacle contacts.

7. The device of claim 1, wherein the circuit interrupter includes at least one movable bus bar element.

8. The device of claim 1, wherein the circuit interrupter includes at least one cantilevered element.

9. The device of claim 1, wherein the circuit interrupter includes at least one movable bridge element.

10. The device of claim 1, wherein the simulated fault condition is a simulated grounded neutral fault condition.

11. The device of claim 1, wherein the simulated fault condition is a simulated ground fault condition.

12. The device of claim 1, wherein the predetermined portion of the AC line cycle is during a negative half cycle portion of the AC line cycle.

13. The device of claim 1, further comprising a user-actuatable button coupled to a switch disposed in a circuit, the user-actuatable button being configured to close the switch such that the circuit conducts a predetermined signal.

14. The device of claim 13, wherein the circuit interrupter is configured to electrically disconnect the first, second and third electrical conductors from each other upon the occurrence of the predetermined signal.

15. The device of claim 13, wherein the predetermined signal produces the simulated fault condition.

16. The device of claim 1, wherein the automated test circuit further comprises: a control circuit coupled to the first, second or third electrical conductor, the control circuit being configured to automatically provide a control signal from time to time during the predetermined portion of the AC line cycle; and a test circuit coupled to the control circuit, the test circuit being configured to produce the simulated fault condition upon the occurrence of the control signal.

17. The device of claim 1, wherein the automated test circuit further comprises an accumulator circuit configured to provide the actuator with a predetermined current when the predetermined time frame has elapsed.

18. The device of claim 1, wherein the automated test circuit further comprises an accumulator circuit coupled to at least one fusible element, the accumulator circuit being configured to conduct a current through the at least one fusible element to cause the plurality of the first, second or third electrical conductors to disconnect.

19. The device of claim 1, wherein the actuator is responsive to the device failure mode signal.

20. The device of claim 1, wherein the device failure mode signal is configured to open at least one fusible element to disconnect the plurality of the first, second or third electrical conductors.

21. The device of claim 1, wherein the plurality of sensors includes a grounded neutral transformer.

22. The device of claim 1, wherein the fault detection assembly includes a toroidal sensor and the simulated fault condition is introduced by conducting an electrical signal on a wire passing through the toroidal sensor, the wire not being one of the first electrical conductor, the second electrical conductor, or the third electrical conductor.

23. A circuit interrupting device comprising:
a first electrical conductor, a second electrical conductor, and a third electrical conductor where the first, second and third electrical conductors are electrically isolated from each other and at least one of said conductors is capable of electrically connecting with the other two conductors such that the first, second and third electrical conductors are electrically connected to each other;
a latch block coupled to the at least one of said conductors capable of electrically connecting with the other two conductors, the latch block having a first opening defined therein and configured to move between a first position which provides electrical continuity between the first, second and third electrical conductors and a second position which breaks electrical continuity between the first, second and third electrical conductors;
a circuit interrupting assembly being energized to movably engage a latch having a second opening defined therein and positioned to substantially align with the first opening of the latch block to move the latch block from the first position to the second position upon the occurrence of a fault detection signal;
a user-actuatable button configured to movably reorient the latch block to the first position when the latch is disengaged by the circuit interrupter to reestablish electrical continuity between the first, second and third electrical conductors after resolution of a fault condition or a simulated fault; and
an automated test circuit coupled to the circuit interrupting assembly, the automated test circuit being configured to automatically provide a simulated fault during a predetermined portion of an AC line cycle to determine if the device is operational wherein the fault detection signal energizes the circuit interrupting assembly without electrically disconnecting the first, second and third electrical conductors from each other, the automated test circuit being further configured to provide a device failure mode signal such that the plurality of the first, second or third electrical conductors are disconnected from each other if the fault detection signal is not detected within a predetermined time frame.

24. The device of claim 23, wherein the automated test circuit operates without execution of software instructions.

25. The device of claim 23, wherein the first electrical conductor is a line conductor and the second electrical conductor is a feed-through load conductor.

26. The device of claim 25, wherein the third electrical conductor includes face receptacle contacts.

27. The device of claim 23, wherein the circuit interrupting assembly includes at least one movable bus bar element.

28. The device of claim 23, wherein the circuit interrupting assembly includes at least one cantilevered element.

29. The device of claim 23, wherein the circuit interrupting assembly includes at least one movable bridge element.

30. The device of claim 23, wherein the simulated fault is a simulated grounded neutral fault condition.

31. The device of claim 23, wherein the simulated fault is a simulated ground fault condition.

32. The device of claim 23, wherein the predetermined portion of the AC line cycle is during a negative half cycle portion of the AC line cycle.

33. The device of claim 23, wherein the user-actuatable button is coupled to a switch disposed in a circuit, the user-actuatable button being configured to close the switch such that the circuit conducts a predetermined signal.

34. The device of claim 33, wherein the circuit interrupting assembly is configured to electrically disconnect the first, second and third electrical conductors from each other upon the occurrence of the predetermined signal.

35. The device of claim 33, wherein the predetermined signal produces the simulated fault.

36. The device of claim 23, wherein the automated test circuit further comprises: a control circuit coupled to the first, second or third electrical conductor, the control circuit being configured to automatically provide a control signal from time to time during the predetermined portion of the AC line cycle; and a test circuit coupled to the control circuit, the test circuit being configured to produce the simulated fault upon the occurrence of the control signal.

37. The device of claim 23, wherein the automated test circuit further comprises an accumulator circuit configured to provide the actuator with a predetermined current when the predetermined time frame has elapsed.

38. The device of claim 23, wherein the automated test circuit further comprises an accumulator circuit coupled to at least one fusible element, the accumulator configured to conduct a current through the at least one fusible element to cause the plurality of the first, second or third electrical conductors to disconnect.

39. The device of claim 23, wherein the automated test circuit includes or is coupled to an end-of-life mechanism configured to permanently decouple the first electrical conductor from the second electrical conductor.

40. The device of claim 23, further compromising a toroidal sensor, the simulated fault being introduced by conducting an electrical signal on a wire passing through the toroidal sensor, the wire not being one of the first electrical conductor, the second electrical conductor, or the third electrical conductor.

41. A circuit interrupting device configured to be coupled to a source of AC power comprising:
   a first electrical conductor, a second electrical conductor, and a third electrical conductor where the first, second and third electrical conductors are electrically isolated from each other and at least one of said conductors is capable of electrically connecting with the other two conductors such that the first, second and third electrical conductors are electrically connected to each other;
   a fault detection assembly including a plurality of sensor elements coupled to the first, second or third electrical conductors, the fault detection assembly being configured to provide a fault detection signal in response to a fault condition or a simulated fault condition;
   a semiconductor switch coupled to the fault detection assembly and configured to conduct in response to the fault detection signal;
   an actuator coupled to the semiconductor switch, the actuator providing an actuator stimulus in response to the semiconductor switch being in a conductive state;
   a circuit interrupter positioned to electrically disconnect the first, second and third electrical conductors from each other upon the occurrence of the actuator stimulus;
   a test control circuit coupled to the first, second or third electrical conductors, the test control circuit being configured to provide an automated test control signal at a predetermined time; and
   an automated test circuit coupled to the test control circuit, the automated test circuit including a single discrete transistor configured to provide the simulated fault condition without the occurrence of the actuator stimulus so that the circuit interrupter does not electrically disconnect the first, second and third electrical conductors from each other, the first automated test circuit being further configured to provide a device failure mode signal such that a plurality of the first, second or third electrical conductors are disconnected from each other if the fault detection signal is not detected within a predetermined time frame.

42. The device of claim 41, further including a reset assembly coupled to the circuit interrupter, the reset assembly including a reset button configured to close a reset switch when manually depressed to conduct a test current, establishment of the test current being a prerequisite for resetting the circuit interrupter.

43. The device of claim 42, wherein the test current is not a simulated fault condition.

44. The device of claim 42, further including a test button assembly configured to mechanically drive the circuit interrupter to disconnect the first, second and third electrical conductors from each other without relying on the actuator stimulus.

45. The device of claim 41, wherein the single discrete transistor provides the simulated fault condition during a predetermined portion of an AC line cycle.

46. The device of claim 41, wherein the single discrete transistor provides the simulated fault condition during a negative half cycle portion of the AC line cycle.

47. The device of claim 41, wherein the simulated fault condition is a simulated ground fault or a simulated grounded neutral condition.

* * * * *